(12) United States Patent
Hu (10) Patent No.: US 9,691,717 B2
(45) Date of Patent: Jun. 27, 2017

(54) FABRICATING PROCESS FOR PACKAGE SUBSTRATE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/264,757

(22) Filed: Sep. 14, 2016

(65) Prior Publication Data

US 2017/0084548 A1   Mar. 23, 2017

Related U.S. Application Data

(60) Provisional application No. 62/219,747, filed on Sep. 17, 2015.

(51) Int. Cl.

| H01L 23/00 | (2006.01) |
|---|---|
| H01L 23/498 | (2006.01) |
| H01L 21/48 | (2006.01) |
| H01L 21/78 | (2006.01) |
| H01L 21/56 | (2006.01) |
| H01L 23/31 | (2006.01) |

(52) U.S. Cl.
CPC .......... *H01L 23/562* (2013.01); *H01L 21/486* (2013.01); *H01L 21/4853* (2013.01); *H01L 21/4857* (2013.01); *H01L 21/563* (2013.01); *H01L 21/566* (2013.01); *H01L 21/568* (2013.01); *H01L 21/78* (2013.01); *H01L 23/3135* (2013.01); *H01L 23/49822* (2013.01); *H01L 23/49827* (2013.01); *H01L 23/49838* (2013.01); *H01L 24/16* (2013.01); *H01L 2224/16227* (2013.01); *H01L 2924/3511* (2013.01)

(58) Field of Classification Search
CPC combination set(s) only.
See application file for complete search history.

(56) References Cited

U.S. PATENT DOCUMENTS

| 9,431,369 B2* | 8/2016 | Chih | H01Q 1/2283 |
|---|---|---|---|
| 2010/0301474 A1* | 12/2010 | Yang | H01L 21/6835 257/737 |
| 2014/0102772 A1* | 4/2014 | Chen | H05K 1/113 174/255 |
| 2015/0135527 A1 | 5/2015 | Hu et al. | |
| 2016/0118312 A1* | 4/2016 | Hu | H01L 23/49833 174/251 |
| 2016/0284620 A1* | 9/2016 | Hu | H01L 21/78 |
| 2016/0353569 A1* | 12/2016 | Furuichi | H05K 1/0298 |
| 2017/0047281 A1* | 2/2017 | Hu | H01L 23/49866 |

* cited by examiner

*Primary Examiner* — Mamadou Diallo
(74) *Attorney, Agent, or Firm* — Hauptman Ham, LLP (57) ABSTRACT

A core substrate is prepared first, a bottom redistribution layer RDL1 is formed. Any warpage of the RDL1 is suppressed by the core substrate. In a later process, warpage is further suppressed by a molding compound encapsulating the core substrate. A plurality of metal pillars are formed passing through the core substrate longitudinally; a top redistribution layer RDL2 is then formed on a top surface of the metal pillars.

13 Claims, 14 Drawing Sheets

FABRICATING PROCESS FOR PACKAGE SUBSTRATE

RELATED APPLICATIONS

The present application claims the benefit of U.S. Provisional Application No. 62/219,747, filed Sep. 17, 2015, the disclosure of which is hereby incorporated by reference herein in its entirety.

BACKGROUND

Technical Field

The present invention relates to a fabricating process for package substrate; especially relates to a warpage reduction fabricating process for package substrate.

Description of Related Art

Since semiconductor package technology has developed toward thinner package substrate with higher circuitry density. However, warpage reduction management is one of the critical issues for package substrate due to mismatch of Coefficient of Thermal Expansion (CTE) among different material layers processed during fabricating.

Figure 1A:
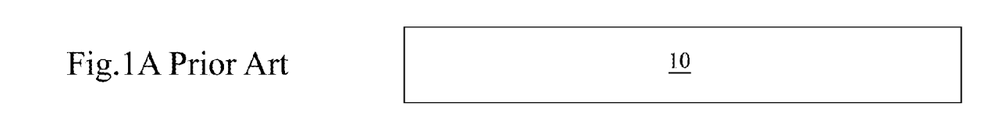
FIGS. 1A~1E show a fabricating process for a semi-product of a prior art.
Figure 1B:
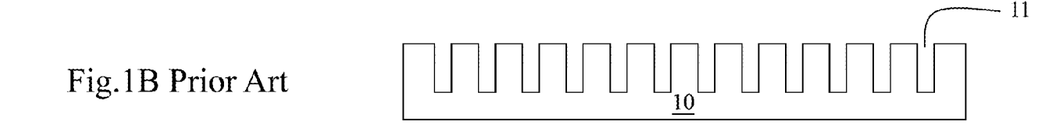
Figure 1C:
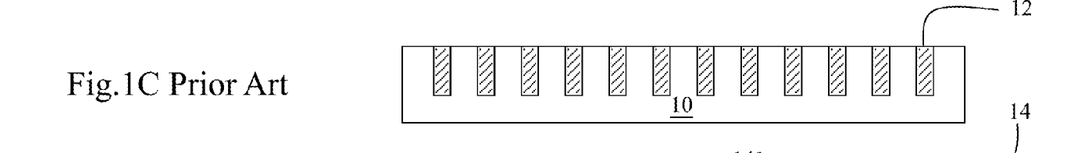
Figure 1D:
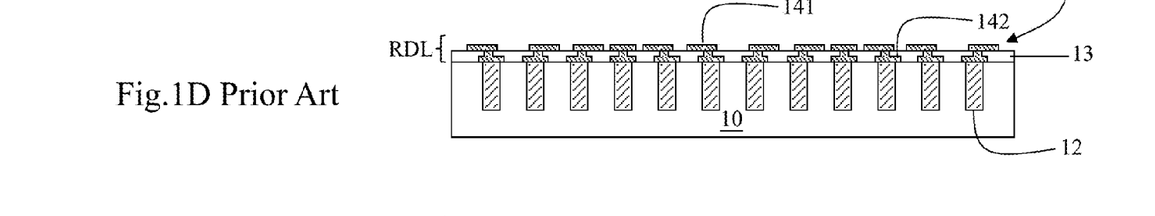
Figure 1E:
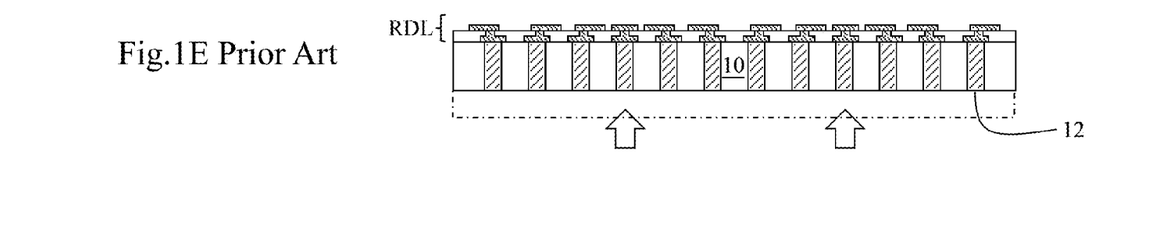

FIG. 1 shows a prior art
FIG. 1 shows a prior art
FIG. 1 shows a prior art US20150135527A1 which disclosed a fabricating process for package substrate, comprising the following steps:

FIG. 1A shows: preparing a core substrate 10.
FIG. 1B shows: filling metal in each hole to form a plurality of holes 11 from top of the core substrate 10; where a depth of the hole 11 is smaller than a thickness of the core substrate 10.
FIG. 1C shows: filling metal in the holes 11 to form a plurality of metal pillars 12 in the core substrate 10.
FIG. 1D shows: forming a redistribution layer RDL on a top surface of the metal pillars 12. The redistribution layer RDL has a redistribution circuitry 14 embedded in dielectric layer 13. The redistribution circuitry 14 has a plurality of top metal pad 141 and a bottom metal pad 142. Each top of the metal pillars 12 is electrically coupled to a bottom surface of a corresponding bottom metal pad 142.
FIG. 1E shows: thinning from bottom of the core substrate 10 to expose a bottom surface of each metal pillar 12.

The prior art disclosed a fabricating process including a redistribution layer RDL that is formed after metal pillars 12 are formed.

DETAILED DESCRIPTION OF THE INVENTION

The present invention disclosed a fabricating process for package substrate including a redistribution layer RDL that is formed before metal pillars 22 is formed. As evidenced in FIG. 2C, wherein a redistribution layer RDL1 is formed, and as evidenced in FIG. 2E, wherein a plurality of metal pillars 22 are formed. Any warpage caused by RDL1 during fabricating is suppressed by the initial thicker core substrate 20.

FIGS. 2A~2E show a semi-product fabricating process according to the present invention.

Figure 2A:
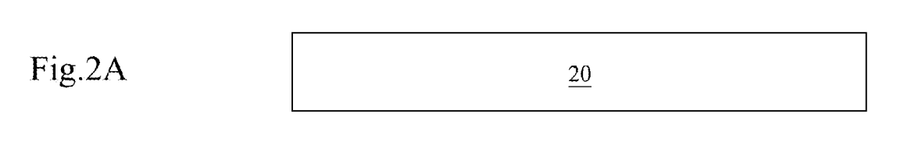
FIGS. 2A~2E show a semi-product fabricating process according to the present invention.
Figure 2B:
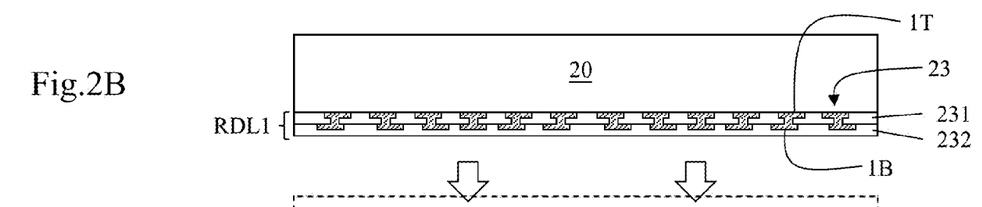
Figure 2C:
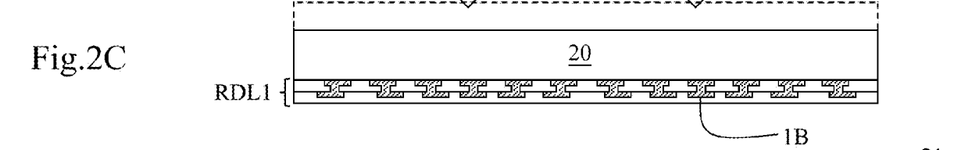
Figure 2D:
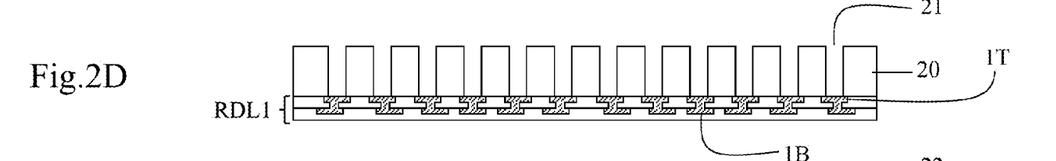
Figure 2E:
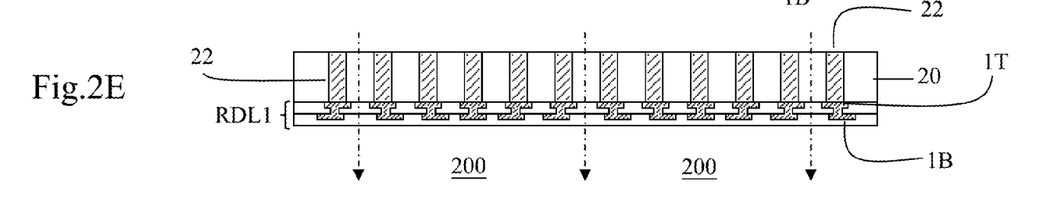

A plurality of semi-products 200 is prepared according to the following steps:

FIG. 2A shows: preparing a core substrate 20.
FIG. 2B shows: forming a bottom redistribution layer RDL1 on a bottom surface of the core substrate 20; wherein the bottom redistribution layer RDL1 has a bottom redistribution circuitry 23B embedded in bottom dielectric layers 231, 232. FIG. 2B shows the bottom redistribution circuitry 23B has a plurality of first top metal pads 1T and a plurality of first bottom metal pad 1B. The thicker core substrate 20 suppresses any warpage which may be caused by the redistribution layer RDL1 during fabricating.
FIG. 2C shows: thinning from top of the core substrate 20.
FIG. 2D shows: forming a plurality of holes 21 from top of the core substrate 20; each of the holes 21 is configured to expose a top surface of a corresponding first top metal pad 1T.
FIG. 2E show: filling metal in each of the plurality of holes 21 to form a plurality of metal pillars 22 passing through the core substrate 20; and obtaining a plurality of semi-products 200 through singulating the product of FIG. 2E.

Figure 3:
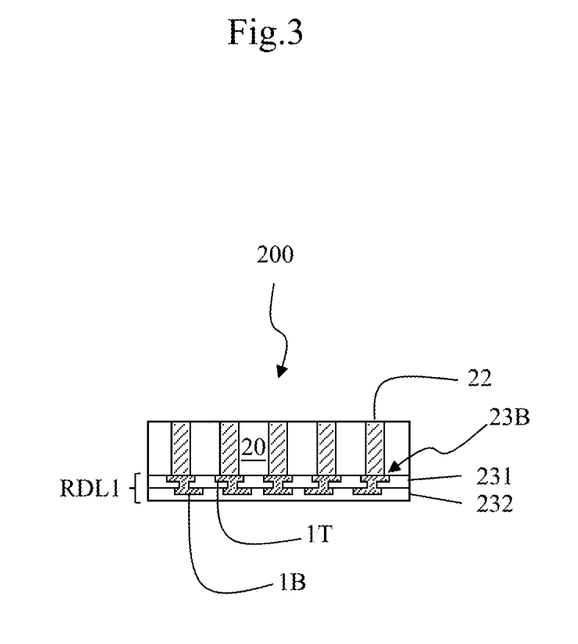
FIG. 3 shows a semi-product unit according to the present invention.

FIG. 3 shows a semi-product unit according to the present invention.

FIG. 3 shows a single unit of the semi-product 200 which has a plurality of metal pillars 22 passing through a core substrate 20. A bottom redistribution circuitry 23B has a plurality of first top metal pads 1T and has a plurality of first bottom metal pads 1B. Each bottom of the metal pillar 22 is electrically coupled to a top surface of one corresponding first top metal pad 1T.

FIGS. 4-9 show a first fabricating process for package substrate.

Figure 4:
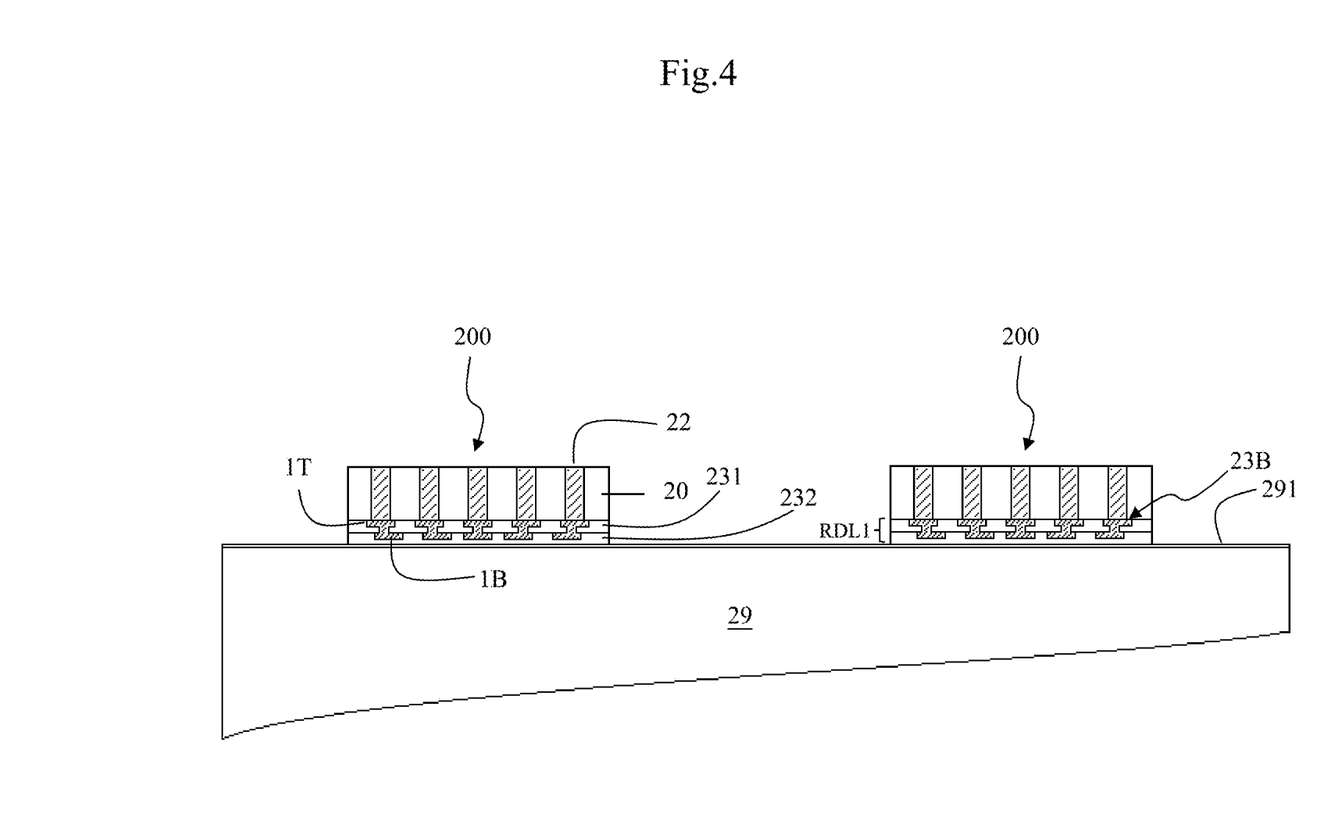
FIGS. 4~9 show a first fabricating process for package substrate.

FIG. 4 shows: preparing a temporary carrier 29 with a release layer 291 configured on a top surface of the temporary carrier 29; and arranging the plurality of semi-products 200 on a top surface of the release layer 291; wherein each semi-product 200 is placed with the metal pillars 22 configured away from the release layer 291.

Figure 5:
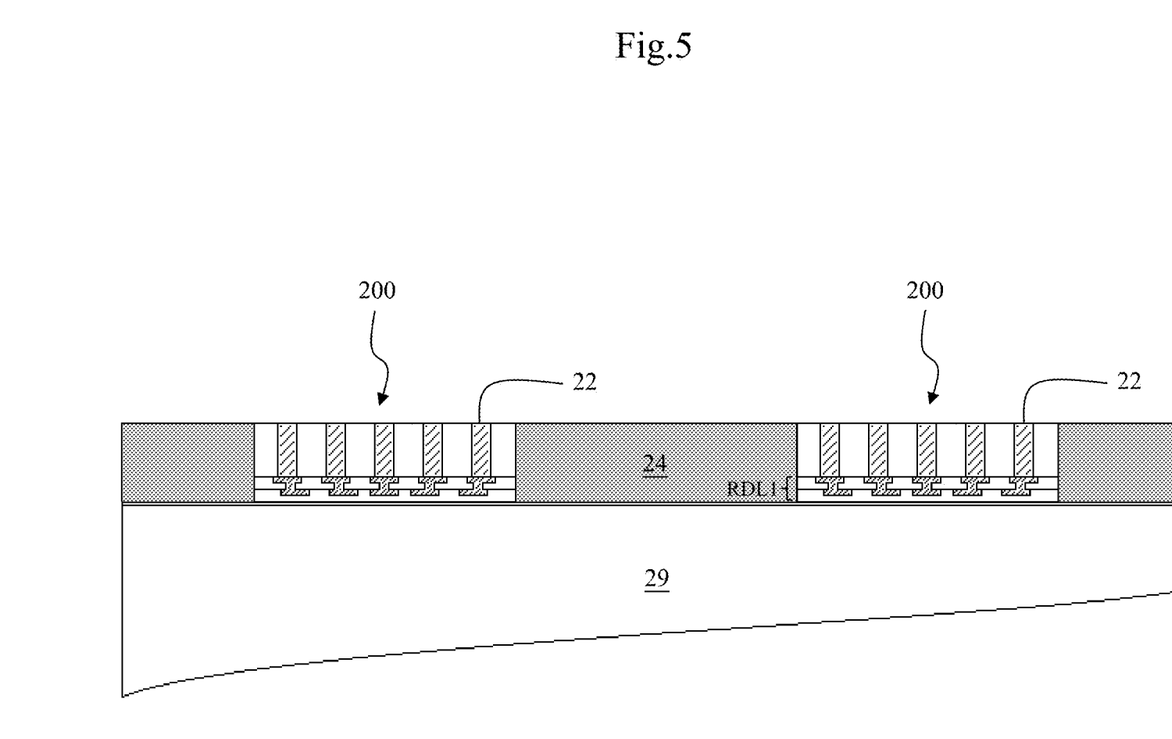
Figure 6:
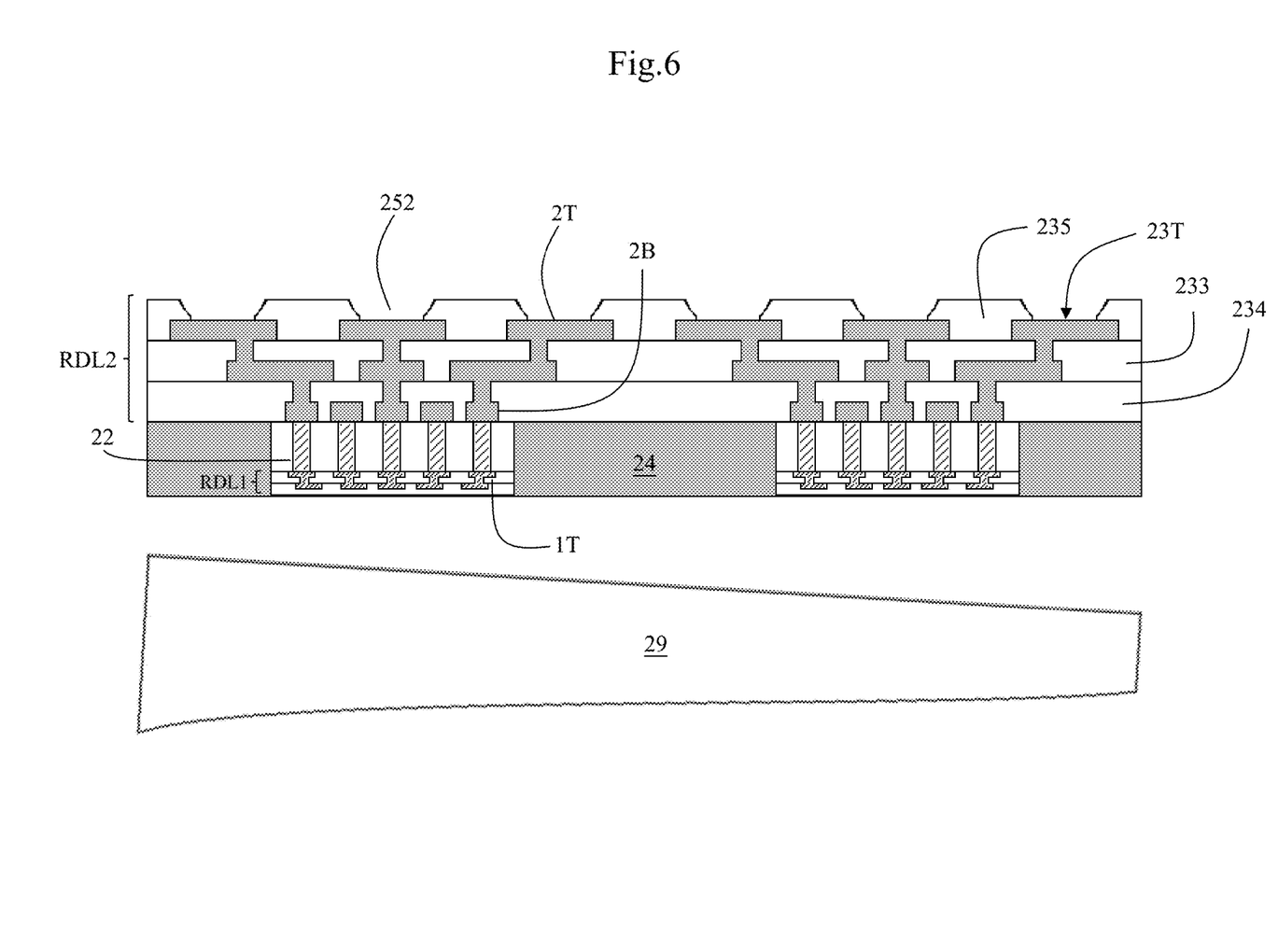

FIG. 5 shows: encapsulating the semi-products 200 with a molding compound 24 wrapping at least four lateral sides of the semi-products 200;

FIG. 6 shows: forming a top redistribution layer RDL2 on a top surface of the plurality of metal pillars 22; wherein the top redistribution layer RDL2 has a top redistribution circuitry 23T embedded in top dielectric layers 233, 234, 235; the top redistribution circuitry 23T has a plurality of second top metal pads 2T configured on top, and has a plurality of second bottom metal pads 2B configured on bottom; wherein each of the metal pillars 22 has a top surface electrically coupled to a bottom of a corresponding second bottom metal pad 2B; forming a plurality of top openings 252 from top of the top dielectric layer 235 to expose a top surface of a corresponding second top metal pad 2T; and removing the temporary carrier 29.

Figure 7:
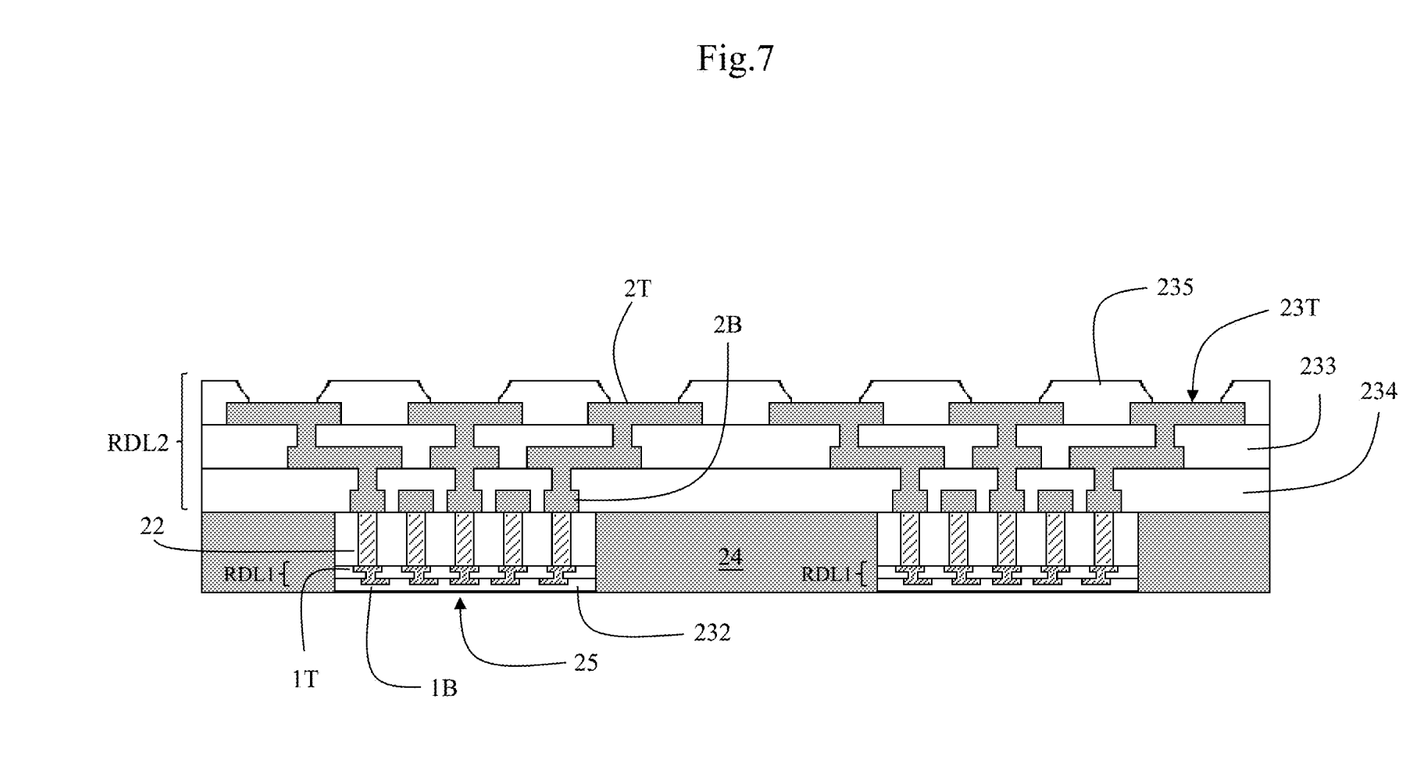

FIG. 7 shows: forming a plurality of bottom openings 25 from bottom of the bottom dielectric layer 232 to expose a bottom surface of each first bottom metal pad 1B.

Figure 8:
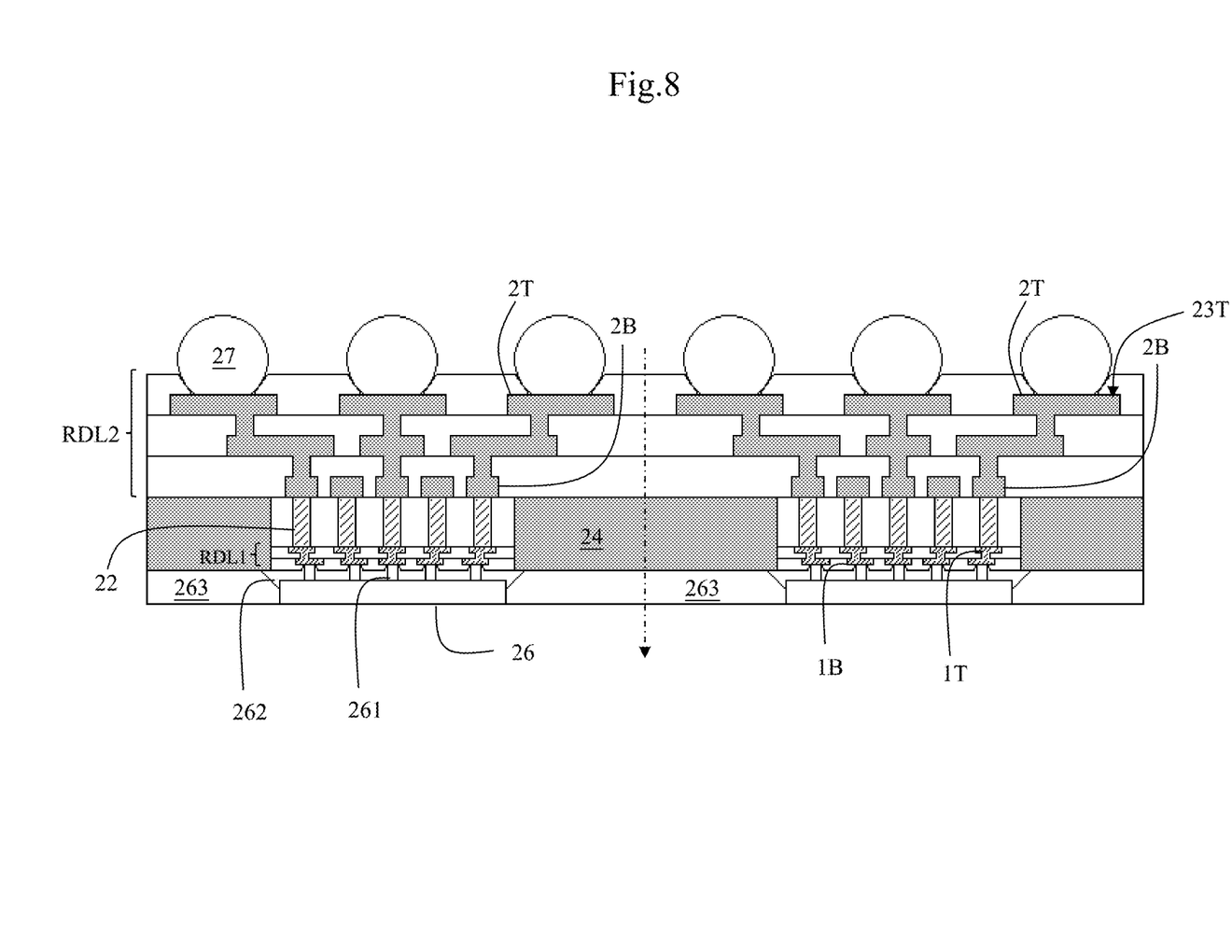

FIG. 8 shows: configuring at least one chip 26 on a bottom surface of the plurality of first bottom metal pads 1B through a plurality of metal pillars 261; filling an underfill material 262 in a space between the chip 26 and the bottom surface of the bottom dielectric layer 232; and applying a molding compound 263 to encapsulate the chip or chips 26; planting a plurality of solder balls 27, each on a top surface of a corresponding second top metal pad 2T; and obtaining a plurality of chip package units through singulating a previous product.

Figure 9:
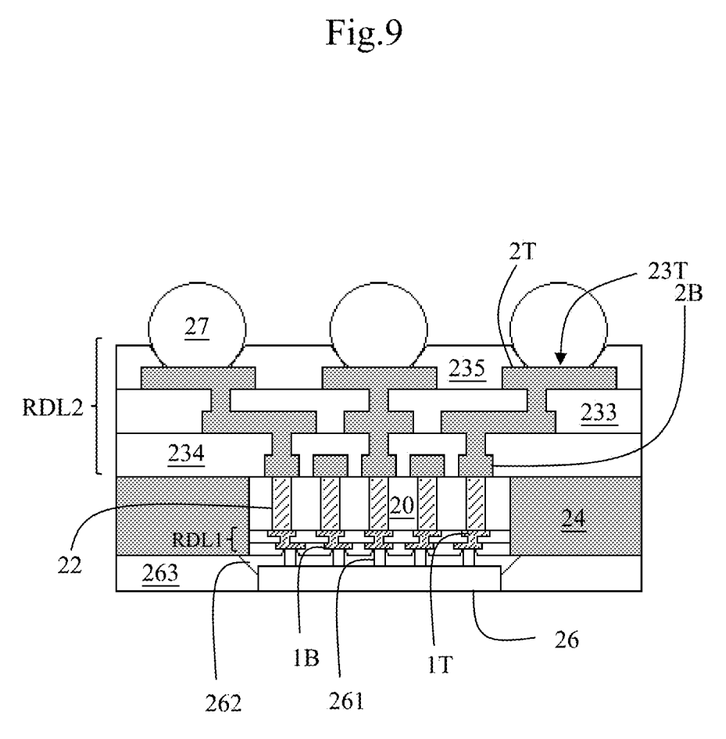

FIG. 9 shows: a single chip package. The chip package has a core substrate 20, a plurality of metal pillars 22 passing through the core substrate 20. A bottom redistribution layer RDL1 is configured on a bottom of the metal pillars 22. A top redistribution layer RDL2 is configured on a top of the metal pillars 22. A molding compound 24 wraps at least four later sides of the core substrate 20 and the RDL1. A chip 26 is electrically coupled to a bottom surface of the first bottom metal pads 1B through a plurality of metal pillars 261.

FIGS. 10A~10E and FIGS. 11~14 show a second fabricating process for package substrate.

Figure 10A:
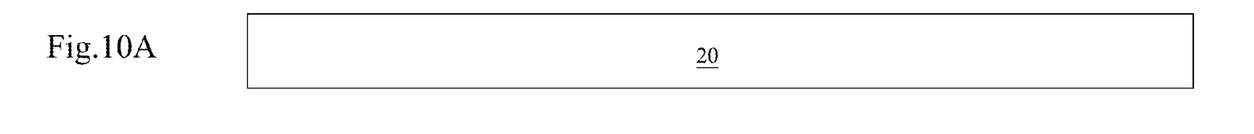
FIGS. 10A~10E and FIGS. 11~14 show a second fabricating process for package substrate.
Figure 10B:
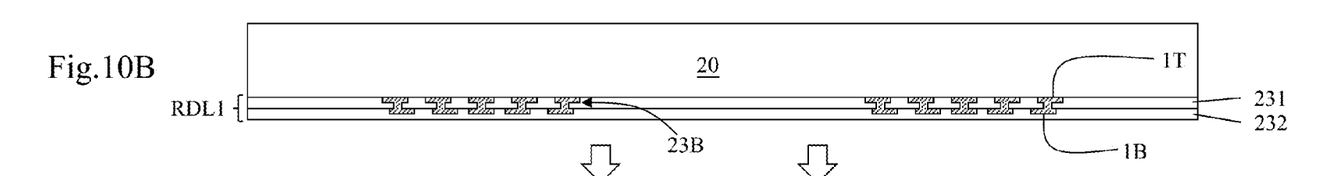

FIG. 10A shows: preparing a core substrate 20;

FIG. 10B shows: forming a bottom redistribution layer RDL1 on a bottom surface of the core substrate 20; wherein the RDL1 has a bottom redistribution circuitry 23B embedded in bottom dielectric layers 231, 232; the bottom redistribution circuitry 23B has a plurality of first top metal pads 1T and a plurality of first bottom metal pads 1B.

Figure 10C:
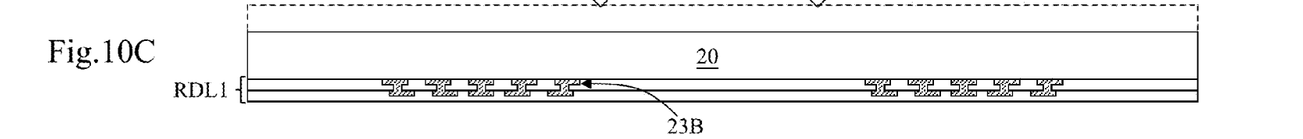

FIG. 10C shows: thinning from top of the core substrate 20.

Figure 10D:
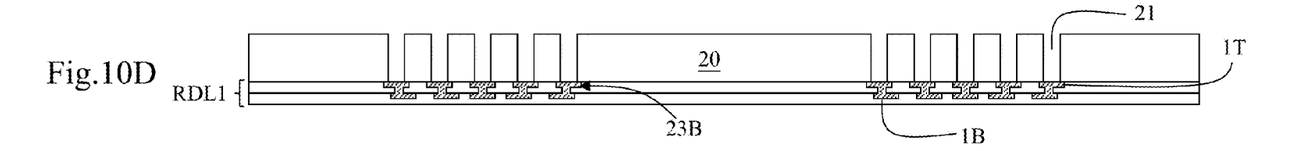

FIG. 10D shows: forming a plurality of holes 21 from top of the core substrate 20.

Figure 10E:
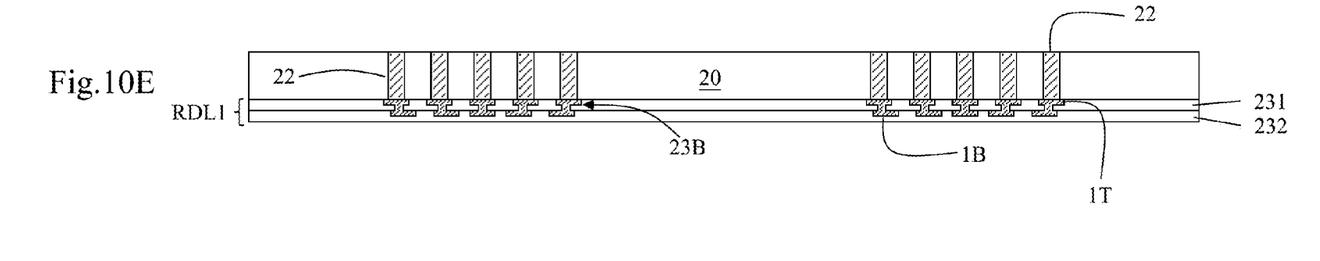

FIG. 10E shows: filling metal in each of the holes to form a plurality of metal pillars 22 passing through the core substrate 20.

Figure 11:
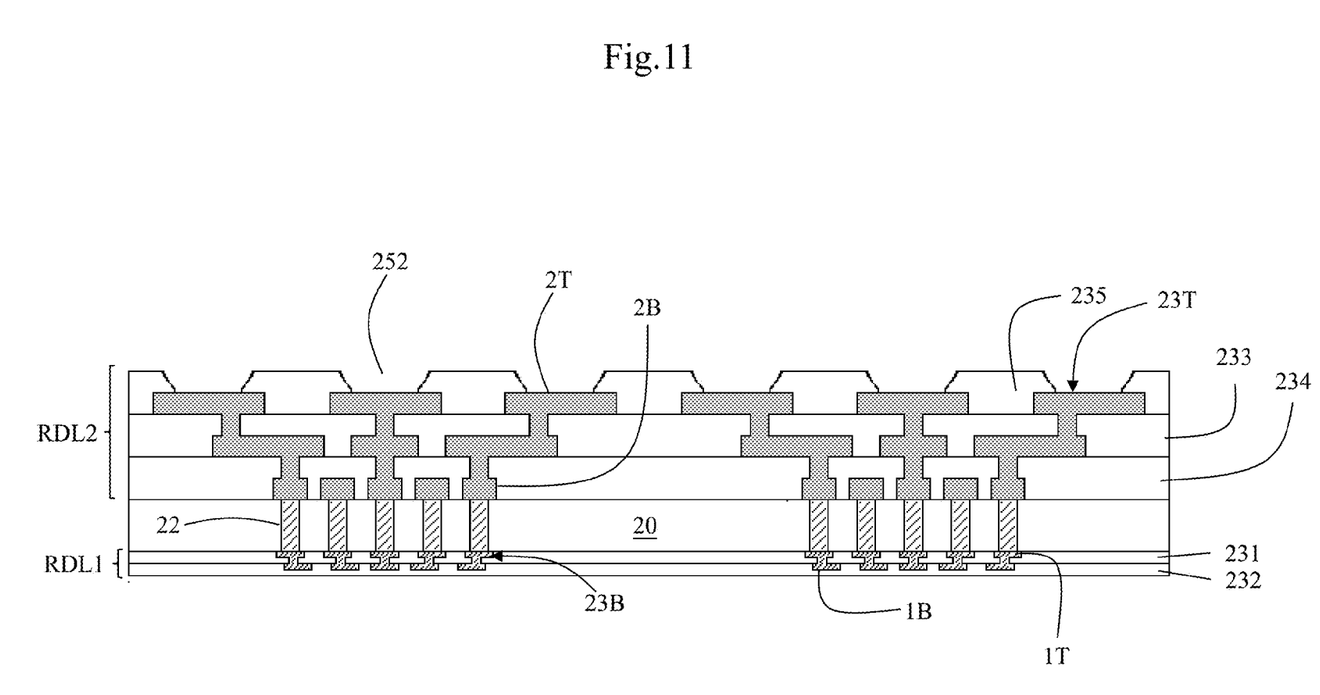

FIG. 11 shows: forming a top redistribution layer RDL2 on a top surface of the plurality of metal pillars 22; wherein the top redistribution layer RDL2 has a top redistribution circuitry 23T embedded in top dielectric layers 233, 234, 235; the top redistribution circuitry 23T has a plurality of second top metal pads 2T, and has a plurality of second bottom metal pads 2B; wherein each of the metal pillars 22 has a top surface electrically coupled to a corresponding second bottom metal pad 2B; and forming a plurality of top openings 252 from top of the top dielectric layer 235 to expose a top surface of each second top metal pad 2T.

Figure 12:
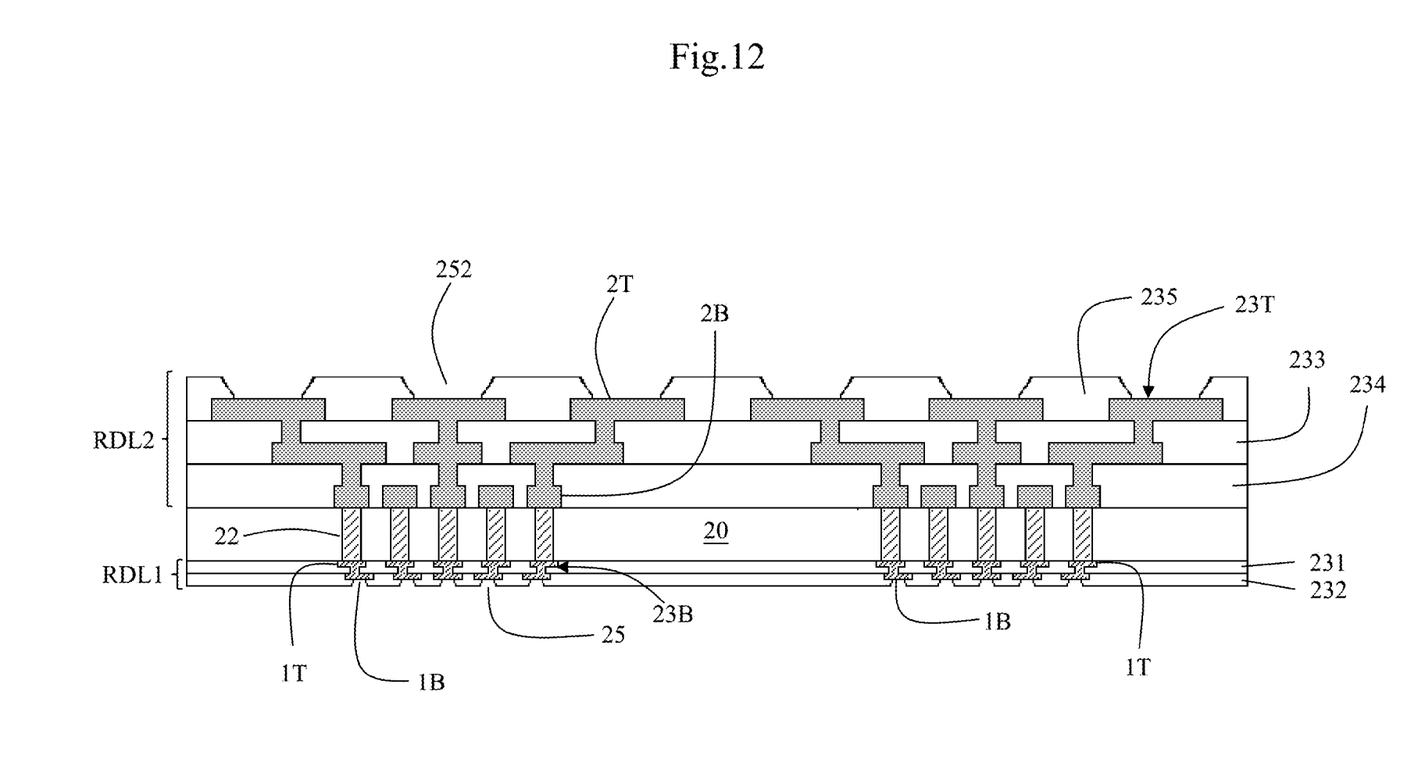

FIG. 12 shows: forming a plurality of bottom openings 25 from bottom of dielectric layer 232 to expose a bottom surface of each first bottom metal pad 1B.

Figure 13:
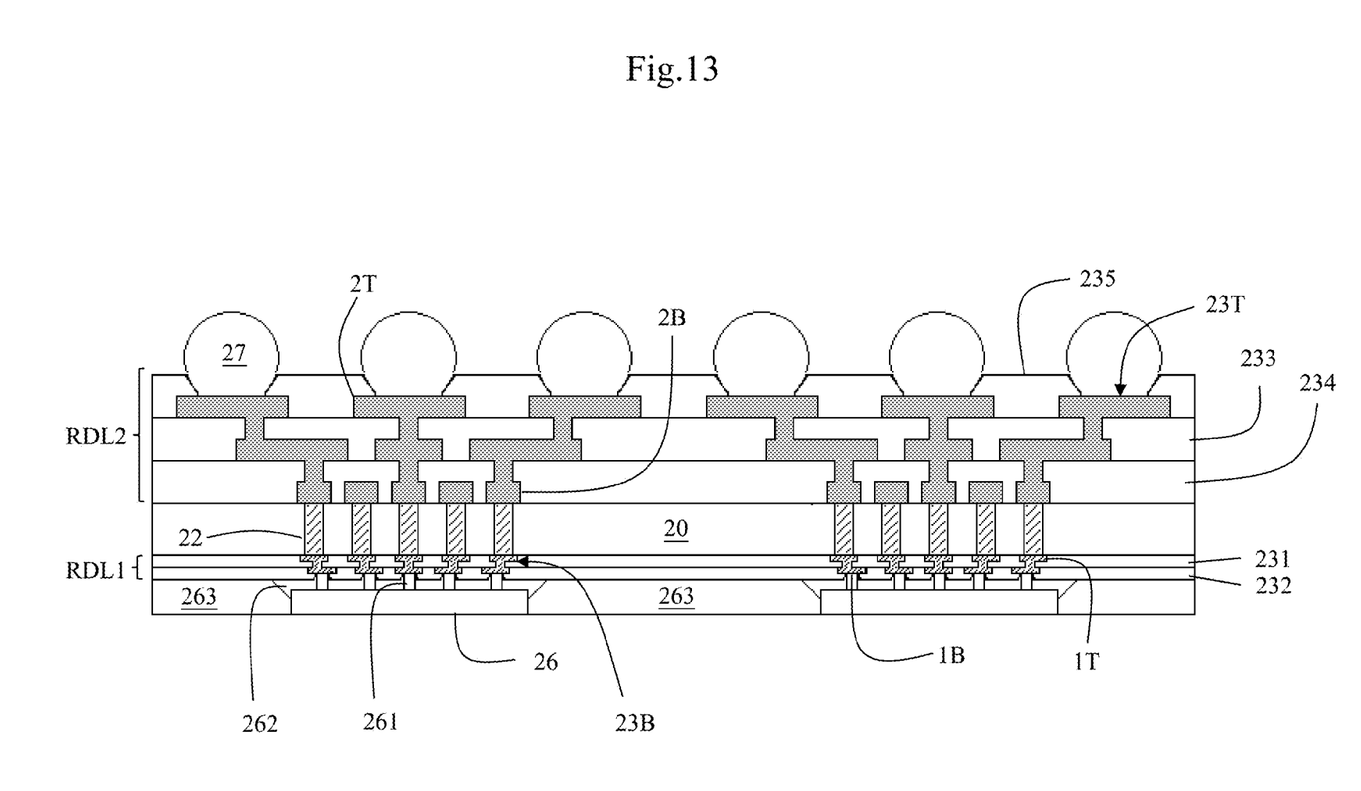

FIG. 13 shows: configuring at least one chip 26 on a bottom surface of the plurality of first bottom metal pads 1B through metal pillars 261; filling an underfill material 262 in a space between the chip 26 and the bottom surface of the bottom dielectric layer 232; applying a molding compound 263 to encapsulate the chip or chips 26; planting a plurality of solder balls 27, each on a top surface of a corresponding second top metal pad 2T; and obtaining a plurality of chip package units through singulating a previous product.

Figure 14:
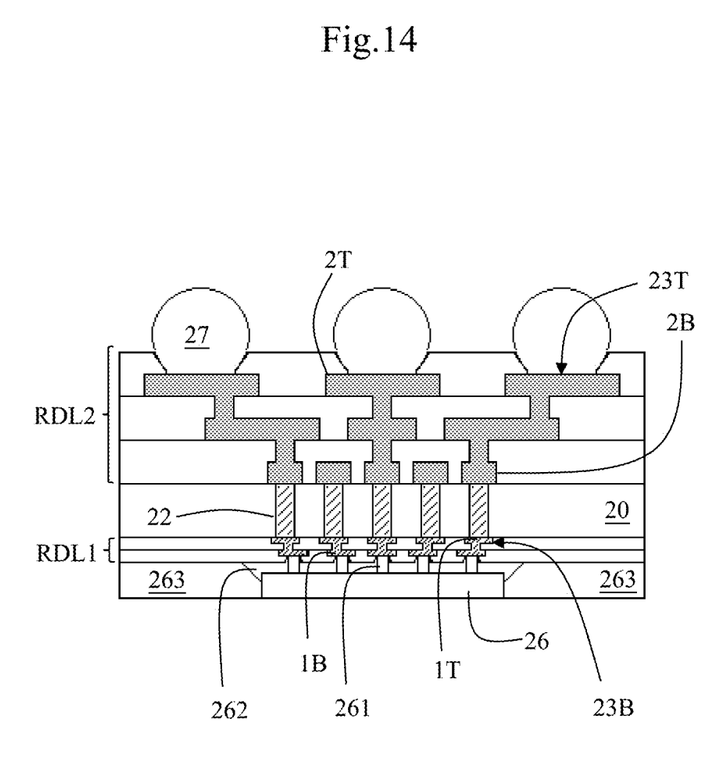

FIG. 14 shows: a single chip package. The chip package has a core substrate 20, a plurality of metal pillars 22 passing through the core substrate 20. A bottom redistribution layer RDL1 is configured on a bottom of the metal pillars 22. A top redistribution layer RDL2 is configured on a top of the metal pillars 22. A plurality of solder balls 27 is configured on top, each solder ball 27 is configured on a top surface of a corresponding second top metal pad 2T. A chip 26 is electrically coupled to a bottom surface of the first bottom metal pads 1B through a plurality of metal pillars 261. An underfill material 262 is filled in a space between the chip 26 and a bottom surface of the RDL1. A molding compound 263 encapsulates the chip 26.

While several embodiments have been described by way of example, it will be apparent to those skilled in the art that various modifications may be configured without departs from the spirit of the present invention. Such modifications are all within the scope of the present invention, as defined by the appended claims.

Numeral System

| |
|---|
| 1B first bottom metal pad |
| 1T first top metal pad |
| 20 core substrate |
| 200 semi-product |
| 21 hole |
| 22 metal pillar |
| 231 dielectric layer |
| 232 dielectric layer |
| 233 dielectric layer |
| 234 dielectric layer |
| 235 dielectric layer |
| 23B bottom redistribution circuitry |
| 23T top redistribution circuitry |
| 24 molding compound |
| 25 bottom opening |
| 252 top opening |
| 26 chip |
| 261 metal pillar |
| 262 underfill material |
| 263 molding compound |
| 27 solder ball |
| 29 temporary carrier |
| 291 release layer |
| 2B second bottom metal pad |
| 2T second top metal pad |
| RDL1 bottom redistribution layer |
| RDL2 top redistribution layer |

What is claimed is:

1. A fabricating process for package substrate, comprising a fabricating process to prepare a plurality of semi-products according to the following steps:
   preparing a core substrate;
   forming a bottom redistribution layer RDL1 on a bottom surface of the core substrate; wherein the RDL1 has a bottom redistribution circuitry embedded in bottom dielectric layers; the bottom redistribution circuitry has a plurality of first top metal pads and a plurality of first bottom metal pads;
   thinning from top of the core substrate;
   forming a plurality of holes from top of the core substrate;
   filling metal in each of the holes to form a plurality of metal pillars passing through the core substrate; and
   obtaining a plurality of semi-products through singulating.

2. A fabricating process for package substrate as claimed in claim 1, further comprising:
   preparing a temporary carrier with a release layer configured on a top surface of the temporary carrier;
   arranging the plurality of semi-products on a top surface of the release layer; wherein each semi-product is placed with the metal pillars configured away from the release layer;
   encapsulating the semi-products with a molding compound wrapping at least four lateral sides of the semi-products;
   forming a top redistribution layer RDL2 on a top surface of the plurality of metal pillars; wherein the top redistribution layer RDL2 has a top redistribution circuitry embedded in top dielectric layers; the top redistribution circuitry has a plurality of second top metal pads, and has a plurality of second bottom metal pads; wherein each of the metal pillars has a top surface electrically coupled to a corresponding second bottom metal pad;

removing the temporary carrier; and forming a plurality of bottom openings from bottom of the bottom dielectric layer to expose a bottom surface of each first bottom metal pad.

3. A fabricating process for package substrate as claimed in claim 2, further comprising:

configuring at least one chip on a bottom surface of the plurality of first bottom metal pads.

4. A fabricating process for package substrate as claimed in claim 3, further comprising:

filling an underfill material in a space between the chip and the bottom surface of the bottom dielectric layer.

5. A fabricating process for package substrate as claimed in claim 4, further comprising:

applying a molding compound to encapsulate the chip or chips.

6. A fabricating process for package substrate as claimed in claim 5, further comprising:

planting a plurality of solder balls, each on a top surface of a corresponding second top metal pad.

7. A fabricating process for package substrate as claimed in claim 6, further comprising:

obtaining a plurality of chip package units through singulating a previous product.

8. A fabricating process for package substrate, comprising:

preparing a core substrate;

forming a bottom redistribution layer RDL1 on a bottom surface of the core substrate; wherein the RDL1 has a bottom redistribution circuitry embedded in bottom dielectric layers; the bottom redistribution circuitry has a plurality of first top metal pads and a plurality of first bottom metal pads;

thinning from top of the core substrate;

forming a plurality of holes from top of the core substrate;

filling metal in each of the holes to form a plurality of metal pillars passing through the core substrate;

forming a top redistribution layer RDL2 on a top surface of the plurality of metal pillars; wherein the top redistribution layer RDL2 has a top redistribution circuitry embedded in top dielectric layers; the top redistribution circuitry has a plurality of second top metal pads, and has a plurality of second bottom metal pads; wherein each of the metal pillars has a top surface electrically coupled to a corresponding second bottom metal pad; and forming a plurality of bottom openings from bottom of the bottom dielectric layer to expose a bottom surface of each first bottom metal pad.

9. A fabricating process for package substrate as claimed in claim 8, further comprising:

configuring at least one chip on a bottom surface of the plurality of first bottom metal pads.

10. A fabricating process for package substrate as claimed in claim 9, further comprising:

filling an underfill material in a space between the chip and the bottom surface of the bottom dielectric layer.

11. A fabricating process for package substrate as claimed in claim 10, further comprising:

applying a molding compound to encapsulate the chip or chips.

12. A fabricating process for package substrate as claimed in claim 11, further comprising:

planting a plurality of solder balls, each on a top surface of a corresponding second top metal pad.

13. A fabricating process for package substrate as claimed in claim 12, further comprising:

obtaining a plurality of chip package units through singulating.

* * * * *